(12) United States Patent
Ma et al.

(10) Patent No.: US 8,889,519 B2
(45) Date of Patent: *Nov. 18, 2014

(54) SEMICONDUCTOR DEVICE AND METHOD FOR MANUFACTURING THE SAME

(71) Applicants: Xiaolong Ma, Beijing (CN); Huaxiang Yin, Beijing (CN); Zuozhen Fu, Beijing (CN)

(72) Inventors: Xiaolong Ma, Beijing (CN); Huaxiang Yin, Beijing (CN); Zuozhen Fu, Beijing (CN)

(73) Assignee: The institute of Microelectronics Chinese Academy of Science, Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 13/812,499

(22) PCT Filed: Oct. 12, 2012

(86) PCT No.: PCT/CN2012/001376
§ 371 (c)(1),
(2), (4) Date: Jan. 26, 2013

(87) PCT Pub. No.: WO2014/026305
PCT Pub. Date: Feb. 20, 2014

(65) Prior Publication Data
US 2014/0054658 A1 Feb. 27, 2014

(30) Foreign Application Priority Data
Aug. 16, 2012 (CN) .......................... 2012 1 0293241

(51) Int. Cl.
*H01L 21/336* (2006.01)
(Continued)

(52) U.S. Cl.
CPC .......... *H01L 29/66477* (2013.01); *H01L 29/78* (2013.01); *H01L 29/161* (2013.01);
(Continued)

(58) Field of Classification Search
CPC ................... H01L 21/02532; H01L 21/02535; H01L 21/02381; H01L 21/0245; H01L 21/02452; H01L 21/02675
USPC .................................................. 438/301, 487
See application file for complete search history.

(56) References Cited

U.S. PATENT DOCUMENTS 7,238,596 B2 * 7/2007 Kouvetakis et al. .......... 438/507
8,039,204 B2 * 10/2011 Watanabe ...................... 430/315
(Continued)

FOREIGN PATENT DOCUMENTS

CN 101928990 A 12/2010
JP 7074403 A 3/1995

*Primary Examiner* — Phat X Cao
(74) *Attorney, Agent, or Firm* — Treasure IP Group

(57) ABSTRACT

The present invention discloses a semiconductor device, comprising: a substrate, a gate stack structure on the substrate, source and drain regions in the substrate on both sides of the gate stack structure, and a channel region between the source and drain regions in the substrate, characterized in that at least one of the source and drain regions comprises a GeSn alloy. In accordance with the semiconductor device and method for manufacturing the same of the present invention, GeSn stressed source and drain regions with high concentration of Sn is formed by implanting precursors and performing a laser rapid annealing, thus the device carrier mobility of the channel region is effectively enhanced and the device drive capability is further improved.

6 Claims, 2 Drawing Sheets

(51) Int. Cl.
| | |
|---|---|
| *H01L 29/66* | (2006.01) |
| *H01L 29/78* | (2006.01) |
| *H01L 29/161* | (2006.01) |
| *H01L 21/02* | (2006.01) |
| *H01L 21/265* | (2006.01) |
| *H01L 29/10* | (2006.01) |
| *H01L 29/165* | (2006.01) |
| *H01L 21/268* | (2006.01) |
| *H01L 29/51* | (2006.01) |

(52) U.S. Cl.
CPC ... *H01L 21/02381* (2013.01); *H01L 21/02675* (2013.01); *H01L 21/0245* (2013.01); *H01L 21/02535* (2013.01); *H01L 21/02452* (2013.01); *H01L 21/02532* (2013.01); *H01L 21/26506* (2013.01); *H01L 21/268* (2013.01); *H01L 29/517* (2013.01); *H01L 29/665* (2013.01); *H01L 29/66575* (2013.01); *H01L 29/66651* (2013.01); *H01L 29/66659* (2013.01); *H01L 29/7848* (2013.01); *H01L 29/1054* (2013.01); *H01L 29/165* (2013.01)
USPC .......................................... 438/301; 438/487

(56) References Cited

U.S. PATENT DOCUMENTS

| | | | |
|---|---|---|---|
| 2007/0032026 A1* | 2/2007 | Ong et al. | 438/301 |
| 2010/0187503 A1* | 7/2010 | Moriyama et al. | 257/24 |
| 2011/0068407 A1* | 3/2011 | Yeh et al. | 257/369 |
| 2012/0241875 A1* | 9/2012 | Tezuka | 257/411 |
| 2014/0048765 A1* | 2/2014 | Ma et al. | 257/12 |

\* cited by examiner

SEMICONDUCTOR DEVICE AND METHOD FOR MANUFACTURING THE SAME

CROSS REFERENCE

This application is a National Phase application of, and claims priority to, PCT Application No. PCT/CN2012/001376, filed on Oct. 12, 2012, entitled 'SEMICONDUCTOR DEVICE AND METHOD FOR MANUFACTURING THE SAME', which claimed priority to Chinese Application No. CN 201210293241.0, filed on Aug. 16, 2012. Both the PCT Application and Chinese Application are incorporated herein by reference in their entireties.

FIELD OF THE INVENTION

The present invention relates to the field of manufacture of a semiconductor integrated circuit, in particular, to a MOSFET having GeSn stressed source and drain regions and method for manufacturing the same.

BACKGROUND OF THE INVENTION

With the on-going development of the integrated circuit technology, particularly the continuous reduction of the device size in scale, various key parameters of the device such as the threshold voltage are also reduced accordingly, the advantages of reduction in the power consumption and increase in the integration can promote the enhancement of the overall performance of the device. However, at the same time, the device drive capability is limited by the traditional technology of silicon material, the carrier mobility is low, thus a problem of a relatively low device drive capability is confronted with. Accordingly, the high mobility channel device finds a very important application prospect in the future.

For existing high mobility channel devices, generally $Si_{1-x}Ge_x$ or $Si_{1-x}C_x$ is adopted as a stressed source/drain region for applying a stress to the Si channel region, or these materials are directly adopted as the substrate and the channel region. The hole mobility may be further enhanced by introducing a compressive strain into $Si_{1-x}Ge_x$, and correspondingly the electron mobility may be further enhanced by introducing a tensile strain into $Si_{1-x}C_x$. However, the lattice constants of the two materials are not sufficiently different from that of Si, they can only provide a limited strain, thus can hardly be applied to the device requiring a higher driving capability.

One alternative material is GeSn alloy, the thin film thereof has a high carrier mobility, and the band structure of the alloy can be adjusted by adjusting the concentration of Sn, thus the material is widely applied to advanced CMOS devices and photoelectronic devices.

However, it needs molecular-beam epitaxy or CVD to form the traditional GeSn alloy, which is still not mature or not compatible with CMOS currently. Besides, since Sn has a very low equilibrium solid solubility in Ge, it is difficult to obtain the $Ge_{1-x}Sn_x$ with the concentration of Sn higher than 1% by conventional processes.

In addition, other high mobility materials such as GaAs and InSb also have the same problem and can hardly be compatible with the Si-based CMOS process.

SUMMARY OF THE INVENTION

Accordingly, the present invention aims to provide a MOSFET having GeSn stressed source and drain regions and method for manufacturing the same, thereby to overcome the defects in traditional technology and enhance the carrier mobility in the device channel region effectively.

The object of the present invention is realized by providing a semiconductor device, comprising: a substrate, a gate stack structure on the substrate, source and drain regions in the substrate on both sides of the gate stack structure, and a channel region between the source and drain regions in the substrate, characterized in that at least one of the source and drain regions comprises GeSn alloy.

Wherein the channel region comprises Si and/or SiGe.

Wherein the concentration of Sn in GeSn alloy is greater than 0 and less than 30%.

Wherein the source and drain regions further comprise raised source and drain regions made of the same material thereon.

Wherein the source and drain regions further comprise a metallized source/drain contact layer.

The present invention also provides a method for manufacturing a semiconductor device, comprising: forming a gate stack structure on a substrate; implanting precursors in the substrate on at least one side of the gate stack structure; and performing a laser rapid annealing such that the precursors react to produce GeSn alloy, thereby to constitute source and drain regions.

Wherein the concentration of Sn in GeSn alloy is greater than 0 and less than 30%.

Wherein the step of implanting precursors further comprises: performing a pre-amorphization ion implantation to form an amorphized region in the substrate; and implanting Sn in the amorphized region.

Wherein the ions used for the pre-amorphization ion implantation include one of Ge, B, Ga and In or combinations thereof.

Wherein the implantation dose of Sn is $5\times10^{15}$-$1\times10^{17}$ cm$^{-2}$.

Wherein after implanting the precursors and before performing the laser rapid annealing, the method further comprises forming a protective layer over the precursors.

Wherein, in the laser rapid annealing process, the pulse number of the laser processing is 1-100, the energy density is 100 mJ/cm$^2$-1 J/cm$^2$, the laser wavelength is about 157 nm-10.6 μm, and the pulse time width is about 1 ns-10 μs.

In accordance with the semiconductor device and method for manufacturing the same of the present invention, GeSn stressed source and drain regions with high concentration of Sn are formed by implanting precursors and performing a laser rapid annealing, thus the device carrier mobility of the channel region is effectively enhanced and the device drive capability is further improved.

BRIEF DESCRIPTION OF THE DRAWINGS

The technical solution of the present invention will be described in detail with reference to the drawings below, wherein.

DETAILED DESCRIPTION OF THE EMBODIMENTS

The features and the technical effects of the technical solution of the present application will be described in detail in combination with the illustrative embodiments with reference to the drawings. It should be pointed out that like reference signs indicate like structures, the terms such as "first", "second", "above", "below", "thickness" and "thin" used in the present invention may be used to describe various device structures. Except for specific explanations, these descriptions do not imply the spatial, sequential or hierarchical relationships of the structures of the described device.

Figure 1:
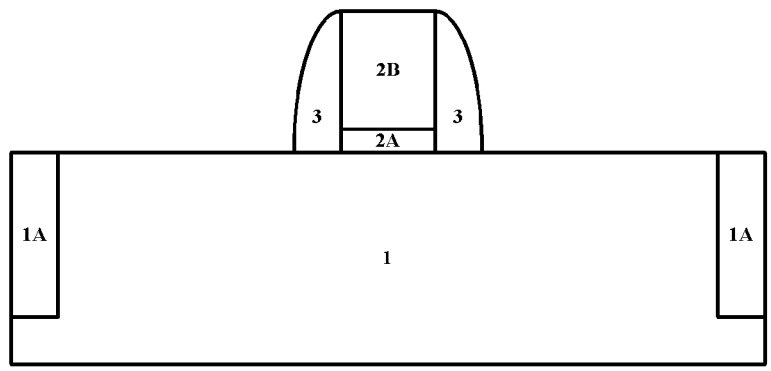
FIGS. 1-3 are diagrammatic cross-sections corresponding to the steps of the method for manufacturing a semiconductor device in accordance with the embodiment of the present invention.
Figure 2:
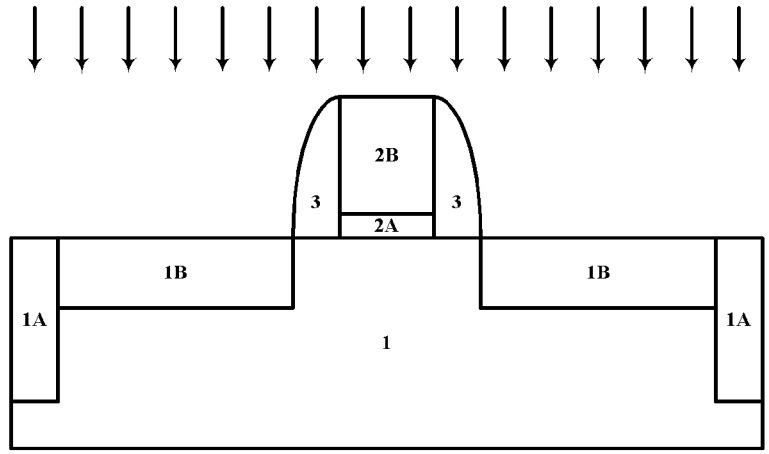
Figure 3:
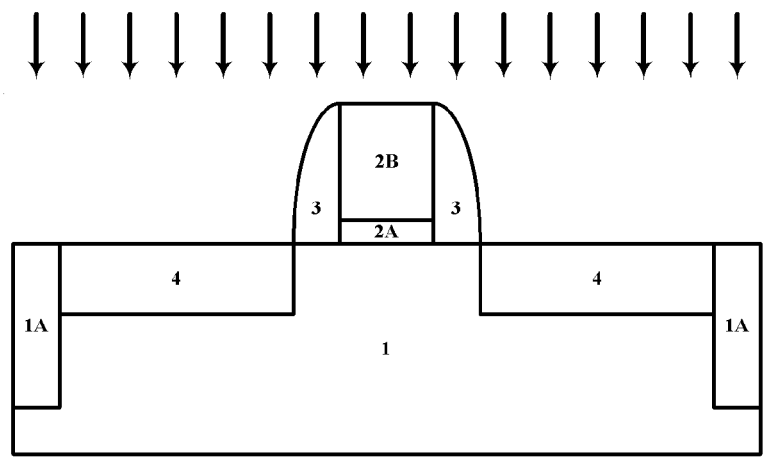

In accordance with an embodiment of the present invention, referring to FIGS. 1 to 3, a conventional MOSFET device structure having GeSn stressed source and drain regions is formed.

First, referring to FIG. 1, a gate stack structure 2 and a gate spacer 3 are formed on a substrate 1.

A substrate 1 is provided. The substrate may either be bulk Si, SOI, bulk Ge, GeOI, SiGe and GeSb, or be III-V group or II-VI group compound semiconductor substrate such as GaAs, GaN, InP and InSb. Furthermore, the substrate may also be a transparent substrate such as glass, plastic, and resin. In order to be compatible with the existing CMOS technology so as to be applied to manufacturing of large-scale digital integrated circuit, the substrate 1 is preferably made of bulk Si (monocrystalline silicon wafer) or SOI wafer.

Etching is first performed in the substrate 1 to form a shallow trench, then oxide (e.g., silicon oxide) is deposited in the shallow trench by a conventional process such as rapid thermal oxidation (RTO), LPCVD, PECVD, and HDPCVD to form shallow trench isolations (STIs) 1A. The substrate region enclosed by the STIs 1A forms the active region of the device.

Preferably, a buried layer (not shown) is formed in the active region enclosed by the STIs 1A for enhancing the stress applied by the source/drain region to the channel region or enhancing the stress of the channel region per se, thereby to further enhance the carrier mobility. The buried layer is made of a material whose lattice constant is between that of the Si substrate and that of GeSn of the subsequent source/drain region, e.g., SiGe. The buried layer may be formed by a process of optionally depositing a buffer layer on the substrate 1, epitaxially growing a SiGe buried layer on the substrate/buffer layer, and optionally epitaxially growing Si or Ge top layer over the buried layer. Furthermore, the buried layer may also be formed by a process of implanting Ge ions into Si substrate to a certain depth, then performing annealing such that the implanted doping ions react with the substrate to form a SiGe buried layer. The distance between the burner layer and the surface of the substrate 1, i.e., the depth of the buried layer may be set by controlling the epitaxial or implanting process parameters depending on the requirement of stress distribution in the channel region, and the depth of the buried layer may be, e.g., about 10-30 nm.

A gate insulating layer 2A and a gate conductive layer 2B are sequentially deposited on the substrate 1 by a conventional process such as LPCVD, PECVD, HDPCVD, MOCVD, MBE, ALD, evaporation, and sputtering and then are etched to form a gate stack structure 2A/2B. In a gate first process, the gate stack structure will be kept all the time. The gate insulating layer 2A is made of a high-K material including but not limited to nitride (e.g., SiN, MN, TiN), metal oxide (mainly including oxide of subgroup and lanthanide metal element such as $Al_2O_3$, $Ta_2O_5$, $TiO_2$, $ZnO$, $ZrO_2$, $HfO_2$, $CeO_2$, $Y_2O_3$, $La_2O_3$), perovskite phase oxide (e.g., $PbZr_xTi_{1-x}O_3$ (PZT), $Ba_xSr_{1-x}TiO_3$ (BST)); the gate conductive layer 2B is metal and/or metal nitride, wherein the metal comprises Al, Ti, Cu, Mo, W, and Ta, and the metal nitride comprises TiN and TaN. In a gate last process, the gate stack structure is a dummy gate stack structure, which will be removed, in the subsequent process. The gate insulating layer 2A comprises silicon oxide and silicon oxynitride. The gate conductive layer 2B is polysilicon or amorphous silicon. The layer 2A may have a thickness of e.g., about 1-5 nm, and the layer 2B may have a thickness of about 10-100 nm.

A dielectric material such as silicon nitride, silicon oxynitride and amorphous diamond like carbon (DLC) is deposited on the substrate 1 and the gate stack structure 2A/2B by a conventional process such as PECVD and HDPCVD and etched to form a gate spacer 3.

Then, referring to FIG. 2, a doping implantation is performed by taking the gate spacer 3 as a mask. Precursors are implanted in the substrate 1 on at least one side of the gate spacer 3 to form a doped region 1B of the precursors.

First, a pre-amorphization ion implantation (PAI) is performed, the implantation energy is, e.g., about 10-200 KeV, and the implantation dose is, e.g., about $1\times10^{15}$-$1\times10^{17}$ $cm^{-2}$. When the substrate 1 is made of Si, the implanted ions are Ge. The implanted ions Ge destroy the lattice of certain areas within the surface of the substrate 1 which are to form the drain region and source region (e.g., within a distance of about 10-20 nm from the surface), so as to amorphize the lattice to form an amorphized region (not shown), facilitating further ion implantation later and formation of an alloy by reaction when annealing is performed.

Preferably, before and/or after the pre-amorphization implantation, impurity ions such as B, Ga and In are further implanted in the amorphized region to adjust the conductivity type and concentration of implanted ions of the source/drain region.

Furthermore, when the substrate 1 is made of SiGe or Si containing a SiGe buried layer (that is, the substrate per se contains Ge), the amorphized implanted ions are impurity ions such as B, Ga and In, and the conductivity type and concentration of implanted ions of the source/drain region are adjusted while performing amorphization, thus no more extra adjustment of the conductivity type and concentration of implanted ions of the source/drain region need to be performed.

After performing the pre-amorphization implantation, Sn is implanted in the amorphized region. The implantation energy is, e.g., about 20-200 KeV, and the implantation dose is, e.g., about $5\times10^{15}$-$1\times10^{17}$ $cm^{-2}$ and preferably $1\times10^{16}$ $cm^{-2}$. Till now, the amorphized region comprises at least two kinds of doping ions Ge and Sn which are to be used as the precursors, to thereby form a doping region 1B of the precursors.

Moreover, the impurity ions such as B, Ga and In may also be implanted after implanting Sn.

Preferably, a protective layer (not shown) is formed over the doping region 1B of the precursors. For example, a low-temperature protective layer is formed by using a process such as PECVD and LPCVD and decreasing the deposition temperature, that is to say, the protective layer, e.g., low temperature silicon oxide (LTO), is deposited in a low temperature. The deposition is performed at a temperature, e.g., lower than 400° C. to avoid that Ge and Sn react in advance. Alternatively, the protective layer may be formed by a process such as spin coating, screen printing and spraying using glass materials such as PSG and BPSG or even resin materials such as photoresist for avoiding damage to materials in the event of the subsequent excessive laser processing. Of course, if the laser processing parameters can be well adjusted, the protective layer may also be omitted.

Then, referring to FIG. 3, a laser rapid annealing is performed such that the Ge and Sn in the doping region 1B of the precursors react to produce GeSn, to thereby form the source region and drain region of the GeSn. A laser pulse is adopted to irradiate the doping region 1B of the precursors such that the temperature rises quickly at the surface of the doping region 1B containing at least two precursors of Ge and Sn which melt, react, then crystallize in a crystal orientation similar to that of the substrate 1 and/or SiGe buried layer during the cooling process, and finally form $Ge_{1-x}Sn_x$ alloy. The alloy has a lattice constant greater than that of the material of the channel, which introduces a compressive strain along a carrier transport direction, to enhance the carrier mobility. Besides, GeSn alloy may also reduce the source/drain contact resistance of the device. The pulse number of the laser processing is m1 (e.g., an integer of about 1-100), the energy density thereof is f1 (e.g., about 100 mJ/cm$^2$-1 J/cm$^2$), the laser wavelength is about 157 nm-10.6 µm and the pulse time width is t1 (e.g., about 1 ns-10 µs). The thickness of the alloy layer and the concentration of Sn in $Ge_{1-x}Sn_x$ (the atomic percent) may be controlled by adjusting the above laser pulse parameters. Preferably, $0<X<0.3$.

It may be appreciated by those skilled in the art that although FIGS. 1 to 3 illustrate source and drain regions of $Ge_{1-x}Sn_x$ alloy are formed on both sides of the gate stack structure 2, respectively, in fact only one of source region and drain region may be made of $Ge_{1-x}Sn_x$ alloy, and the other may be made of common Si or SiGe.

Figure 4:
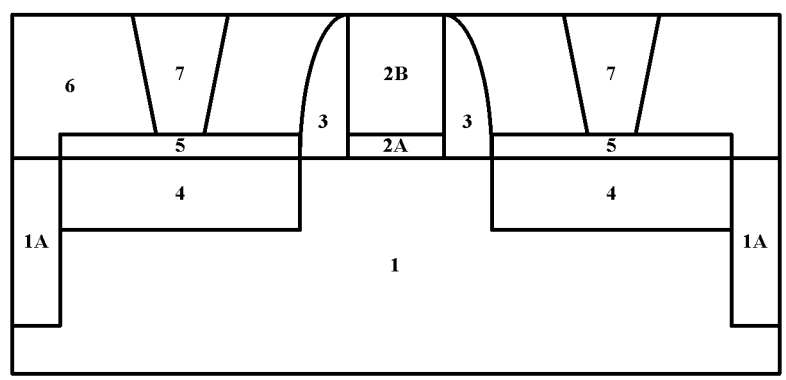
FIG. 4 is a cross-sectional view of the semiconductor device in accordance with the embodiment of the present invention.

Thereafter, referring to FIG. 4, the conventional gate first or gate last process may be continuously used to complete the manufacturing of MOSFET. For example, a source/drain metallized contact layer 5 made of a metal silicide or a metal germanide is formed on the GeSn source and drain regions, to further reduce source/drain contact resistance. An interlayer dielectric layer (ILD) 6 of a low-K material is deposited on the entire device. The ILD 6 is etched to form source/drain contact holes until the source/drain metallized contact layer 5 is exposed, and metal such as W, Cu, Al and Mo or metal nitride such as TiN and TaN is deposited in the contact holes to form source/drain contact plugs 7. It shall be noted that although in the structure shown in FIG. 4 the gate stack structure comprises gate insulating layer 2A and the gate conductive layer 2B laminated in parallel, as in the case of a gate first process, it may also be applicable to a gate last process, that is, the gate insulating layer 2A encloses the bottom and sides (not shown in FIG. 4) of the gate conductive layer 2B in the gate trench.

Accordingly, the semiconductor device in accordance with the embodiment of the present invention comprises a substrate, a gate stack structure on the substrate, source and drain regions in the substrate on both sides of the gate stack structure, and a channel region between the source and drain regions in the substrate, characterized in that at least one of the source and drain regions comprises GeSn alloy. Furthermore, the channel region comprises Si or SiGe.

In accordance with the semiconductor device and method for manufacturing the same of the present invention, GeSn stressed source and drain regions with high concentration of Sn are formed by implanting precursors and performing a laser rapid annealing, thus the device carrier mobility of the channel region is effectively enhanced and the device drive capability is further improved.

Although the present invention has been described with reference to one or more illustrative embodiments, it may be appreciated by those skilled in the art that various appropriate modifications and equivalents can be made to the method for forming the device structure without departing from the scope of the present invention. Besides, many modifications adaptable to specific situations or materials can be made under the disclosed teaching without departing from the scope of the present invention. Therefore, it is not intended to limit the present invention to the specific embodiments which are disclosed as the preferred embodiments for implementing the present invention, the disclosed device structure and the manufacturing method thereof will include all the embodiments that come within the scope of the present invention.

What is claimed is:

1. A method for manufacturing a semiconductor device, comprising:
   forming a gate stack structure on a substrate;
   implanting precursors in the substrate on at least one side of the gate stack structure; and
   performing a laser rapid annealing such that the precursors react to produce a GeSn alloy, thereby to constitute source and drain regions,
   wherein the step of implanting precursors further comprises:
   performing a pre-amorphization ion implantation to form an amorphized region in the substrate; and
   implanting Sn in the amorphized region.

2. The method for manufacturing a semiconductor device of claim 1, wherein the concentration of Sn in GeSn alloy is more than 0 and less than 30%.

3. The method for manufacturing a semiconductor device of claim 1, wherein the ions used for the pre-amorphization ion implantation include one of Ge, B, Ga and In or combinations thereof.

4. The method for manufacturing a semiconductor device of claim 1, wherein the implantation dose of Sn is 5×1015–1×1017 cm-2.

5. The method for manufacturing a semiconductor device of claim 1, wherein after implanting the precursors and before performing the laser rapid annealing, the method further comprises forming a protective layer over the precursors.

6. The method for manufacturing a semiconductor device of claim 1, wherein, in the laser rapid annealing process, the pulse number of the laser processing is 1-100, the energy density is 100mJ/cm2-1 J/cm2, the laser wavelength is 157 nm-10.6 µm, and the pulse time width is 1 ns-10 µs.

* * * * *